(12) United States Patent
Chen

(10) Patent No.: US 8,836,415 B2
(45) Date of Patent: Sep. 16, 2014

(54) VOLTAGE CONTROL CIRCUIT

(71) Applicant: Hon Hai Precision Industry Co., Ltd., New Taipei (TW)

(72) Inventor: Chun-Sheng Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/906,504

(22) Filed: May 31, 2013

(65) Prior Publication Data

US 2013/0328598 A1 Dec. 12, 2013

(30) Foreign Application Priority Data

Jun. 12, 2012 (CN) .......................... 2012 1 01915009

(51) Int. Cl.
*G05F 1/10* (2006.01)
*H03K 3/01* (2006.01)
*G06F 1/32* (2006.01)

(52) U.S. Cl.
CPC ................ *H03K 3/01* (2013.01); *G06F 1/3296* (2013.01)

USPC ......................................................... 327/540

(58) Field of Classification Search
CPC ............ G05F 1/56; G05F 1/565; G05F 1/575
USPC .......... 327/534, 535, 537, 538, 540, 541, 543
See application file for complete search history.

(56) References Cited

U.S. PATENT DOCUMENTS

| 6,433,584 B1 * | 8/2002 | Hatae ............................... 326/80 |
| 6,943,613 B2 * | 9/2005 | Miyazaki et al. ............. 327/534 |
| 7,417,489 B2 * | 8/2008 | Fujita et al. ................... 327/534 |
| 8,314,647 B2 * | 11/2012 | Shimizu et al. ............... 327/534 |

* cited by examiner

*Primary Examiner* — Jeffrey Zweizig
(74) *Attorney, Agent, or Firm* — Novak Druce Connolly Bove + Quigg LLP

(57) ABSTRACT

A control circuit includes a basic input output system (BIOS) chip, an embedded controller (EC), and a regulation unit. The BIOS chip outputs control signals corresponding to various operating frequencies of an electronic element. A digital-to-analog conversion unit of the EC receives the control signals, and outputs different types of analog voltages to the regulation unit. The regulation unit provides a proper voltage to the electronic element in relation to the operating frequency of the electronic element.

5 Claims, 1 Drawing Sheet

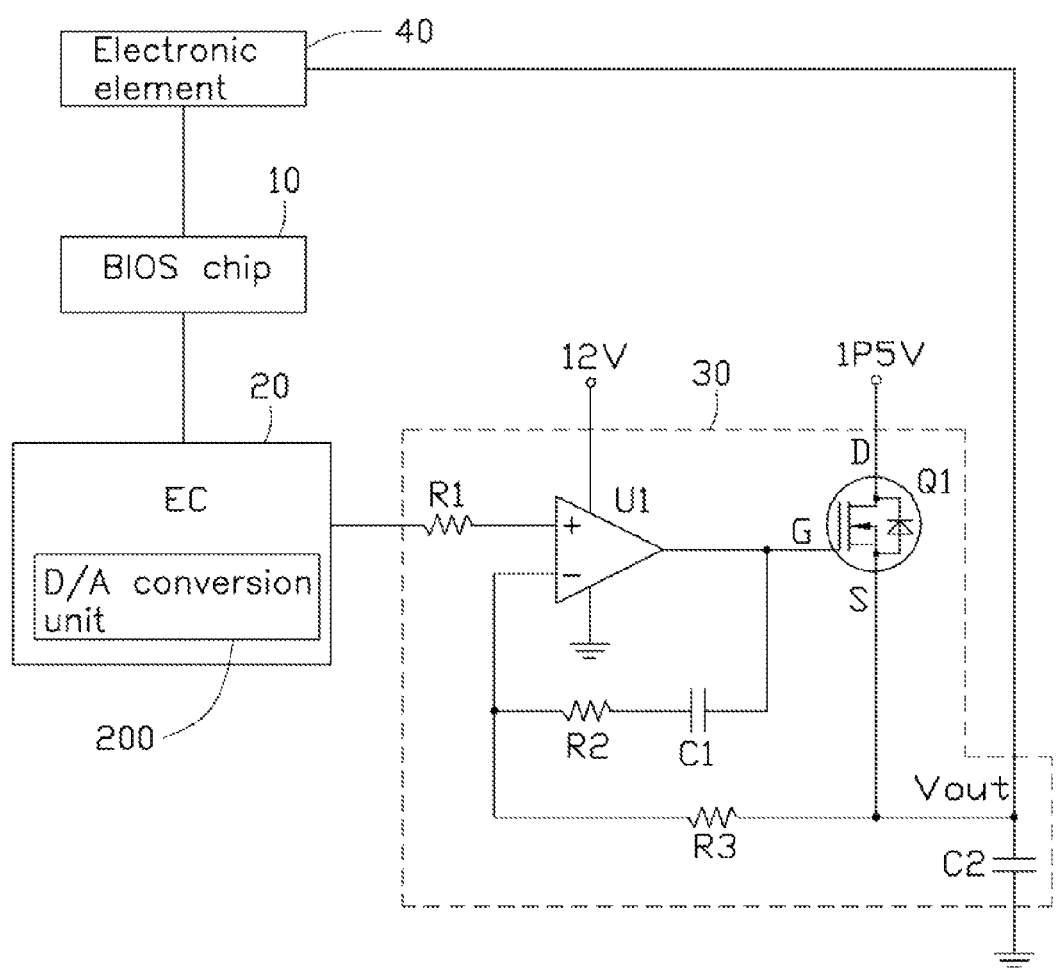

VOLTAGE CONTROL CIRCUIT

BACKGROUND

1. Technical Field

The present disclosure relates to a voltage control circuit.

2. Description of Related Art

With the increasing of an operating frequency of a central processing unit (CPU) from 3.4 gigahertz (GHz) to 4 GHz, an operating voltage of the CPU needs to be changed from 1.2 volts (V) to 1.5V, for example. A basic input output system (BIOS) chip is employed to control a plurality of switches to turn on or off, thereby controlling the operating voltage of the CPU. For example, the BIOS chip may establish a configuration that first and second switches may be turned on, and a third switch is turned off, thus the operating voltage of the CPU may be 1.2V. When the BIOS chip establishes an another configuration that the first and third switches are turned on, and the second switch is turned off, the operating voltage of the CPU then is changed to 1.5V. However, the switches may occupy a lot of space on a motherboard, which increases cost of the motherboard.

Therefore, there is need for improvement in the art.

BRIEF DESCRIPTION OF THE DRAWING

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

The figure is a circuit diagram of an embodiment of a voltage control circuit of the present disclosure.

DETAILED DESCRIPTION

The figure illustrates an embodiment of a voltage control circuit of the present disclosure. The control circuit includes a basic input output system (BIOS) chip 10 configured to output a control signal corresponding to operating frequencies of an electronic element 40, an embedded controller (EC) 20 configured to output an analog voltage in relation to the operating frequency, and a regulation unit 30 configured to provide power for the electronic element 40. In one embodiment, the electronic element 40 is a central processing unit (CPU).

The BIOS chip 10 outputs a control signal with "01" in response to the operating frequency of the electronic element 40 being 3.4 gigahertz (GHz) for example, and outputs a control signal with "FF" in response to the operating frequency of the electronic element 40 being 4 GHZ, for example. In the embodiment, the "01" and "FF" are hexadecimal numbers.

The EC 20 includes a digital-to-analog (D/A) conversion unit 200. The D/A conversion unit 200 receives the control signal from the BIOS chip 10, and outputs an analog voltage corresponding to the control signal. For example, if the D/A conversion unit 200 receives the control signal with "01", a first analog voltage with 1.2 volts (V) is then output by the D/A conversion unit 200. If the D/A conversion unit 200 receives the control signal with "FF", a second analog voltage with 1.5V is then output by the D/A conversion unit 200.

The regulation unit 30 includes an amplifier U1, an electronic switch Q1, three resistors R1-R3, and two capacitors C1 and C2. A non-inverting terminal of the amplifier U1 is coupled to the EC 20 through the resistor R1 to receive the analog voltage. An output terminal of the amplifier U1 is coupled to a first terminal of the electronic switch Q1. A second terminal of the electronic switch Q1 is coupled to a power terminal 1P5V. An inverting terminal of the amplifier Uf1 is coupled to the output terminal of the amplifier U1 through the resistor R2 and the capacitor C1 in that order, and then coupled to a third terminal of the electronic switch Q1 through the resistor R3. A power terminal of the amplifier U1 is coupled to a power terminal 12V, and a ground terminal of the amplifier U1 is connected to ground. The third terminal of the electronic switch Q1 is grounded through the capacitor C2. A node between the third terminal of the electronic switch Q1 and the capacitor C2 functions as an output Vout of the control circuit, used to provide power for the electronic element 40.

When the first terminal of the electronic switch Q1 is at low voltage level, such as logic 0, the electronic switch Q1 is turned off. When the first terminal of the electronic switch Q1 is at high voltage level, such as logic 1, the electronic switch Q1 is turned on. In the illustrated embodiment, the electronic switch Q1 is an n-channel metal oxide semiconductor field-effect transistor (NMOSFET), where the gate, the drain, and the source of the NMOSFET are the first, second, and third terminal of the electronic switch Q1.

When the operating frequency of the electronic element 40 is 3.4 GHz, the voltage of the electronic element 40 should be 1.2V. Hence, the BIOS chip 10 outputs the control signal with "01" to the EC 10. The D/A conversion unit 200 of the EC 20 outputs the first analog voltage to the non-inverting terminal of the amplifier U1, the output terminal of the amplifier U1 outputs a high level amplified voltage signal as the voltage of the inverting terminal being less than the voltage of the non-inverting terminal. The electronic switch Q1 is turned on when the first terminal of the electronic switch receives the high level amplified voltage signal, and the second terminal is connected to the third terminal of the electronic switch Q1. Accordingly, the voltage provided by the node is increasing gradually. The voltage of the inverting terminal of the amplifier U1 is increasing gradually, too. Until the voltage of the inverting terminal is equal to the voltage of the non-inverting terminal of the amplifier U1, the output terminal of the amplifier U1 outputs a low level amplified voltage signal to the first terminal of the electronic switch Q1. The electronic switch Q1 is turned off. The second terminal is disconnected from the third terminal of the electronic switch Q1, and the voltage of the third terminal of the electronic switch Q1 is reduced gradually, so that the voltage of the inverting terminal of the amplifier U1 is reduced synchronically. When the voltage of the non-inverting terminal is greater than the voltage of the inverting terminal of the amplifier U1, the output terminal of the amplifier U1 then outputs the high level amplified voltage signal. The regulation circuit repeatedly adjusts the voltage of the output Vout. Finally, the node between the third terminal of the electronic Q1 and the capacitor C2 provides the 1.2V volts, to enable the electronic element 40 to operate in an operating frequency of 3.4 GHz.

When the operating frequency of the electronic element 40 needs to increase to 4 GHz, the BIOS chip 10 outputs the control signal with "FF" to the EC 20. The D/A conversion unit 200 of the EC 20 outputs the second voltage. The voltage of the non-inverting terminal is greater than the voltage of the inverting terminal of the amplifier U1, and the electronic switch Q1 is still turned on. In addition, the node between the third terminal of the electronic switch Q1 and the capacitor C2 will provide a voltage of 1.5V, thereby enabling the electronic element 40 to operate in an operating frequency of 4 GHz.

While the disclosure has been described by way of example and in terms of a preferred embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A control circuit, comprising:
   a basic input output system (BIOS) chip configured to output control signals corresponding to different operating frequencies of an electronic element;
   an embedded controller (EC) comprising a digital-to-analog (D/A) conversion unit, wherein the D/A conversion unit is configured to receive the control signals, and output different analog voltages according to the control signals; and
   a regulation unit configured to provide a proper voltage to the electronic element in relation to the operating frequency of the electronic element.

2. The control circuit of claim 1, wherein the regulation unit comprises an amplifier, first and second resistors, a first capacitor, and an electronic switch; a non-inverting terminal of the amplifier is coupled to the EC to receive the analog voltage; a first terminal of the electronic switch is coupled to an output terminal of the amplifier, a second terminal of the electronic switch is coupled to a first power terminal, a third terminal of the electronic switch is coupled to an inverting terminal of the amplifier through the first resistor, the inverting terminal of the amplifier is coupled to the output terminal of the amplifier through the second resistor and the capacitor in that order, a power terminal of the amplifier is coupled to a second power terminal, and a ground terminal of the amplifier is connected to ground, a node between the third terminal of the electronic switch and the inverting terminal of the amplifier is used to provide the proper voltage for the electronic element; when the first terminal of the electronic switch is at a low voltage level, the second terminal and the third terminal of the electronic switch are connected to each other; when the first terminal of the electronic switch is at a high voltage level, the second terminal and the third terminal of the electronic switch are disconnected from each other.

3. The control circuit of claim 2, wherein the electronic switch is an n-channel metal oxide semiconductor field-effect transistor (NMOSFET); the gate, drain, and source of the NMOSFET are the first, second, and third terminals of the electronic switch, respectively.

4. The control circuit of claim 2, wherein the regulation unit further comprises a third resistor, wherein the non-inverting terminal of the amplifier is coupled to the EC through the third resistor.

5. The control circuit of claim 4, wherein the regulation unit further comprises a second capacitor, wherein the third terminal of the electronic switch is connected to ground through the second capacitor.

\* \* \* \* \*